(12) United States Patent
Valdivia et al.

(10) Patent No.: US 8,394,723 B2
(45) Date of Patent: Mar. 12, 2013

(54) ASPECT RATIO ADJUSTMENT OF MASK PATTERN USING TRIMMING TO ALTER GEOMETRY OF PHOTORESIST FEATURES

(75) Inventors: Juan Valdivia, Fremont, CA (US); Shibu Gangadharan, Boise, CA (US); Dave March, Eagle, ID (US); Charles Potter, Eagle, ID (US)

(73) Assignee: Lam Research Corporation, Fremont, CA (US)

( * ) Notice: Subject to any disclaimer, the term of this patent is extended or adjusted under 35 U.S.C. 154(b) by 318 days.

(21) Appl. No.: 12/684,032

(22) Filed: Jan. 7, 2010

(65) Prior Publication Data

US 2011/0163420 A1    Jul. 7, 2011

(51) Int. Cl.
*H01L 21/3065* (2006.01)
*H01L 29/06* (2006.01)

(52) U.S. Cl. ............... 438/710; 257/618; 257/E21.218; 257/E29.022

(58) Field of Classification Search .................. 438/710; 257/618, E21.218, E29.022
See application file for complete search history.

(56) References Cited

U.S. PATENT DOCUMENTS

| | | | |
|---|---|---|---|
| 7,018,780 B2 * | 3/2006 | Vahedi et al. | 430/314 |
| 7,491,343 B2 | 2/2009 | Adams et al. | |
| 7,547,636 B2 * | 6/2009 | Chi et al. | 438/714 |
| 2009/0050271 A1 | 2/2009 | Goyal et al. | |
| 2009/0191711 A1 | 7/2009 | Rui et al. | |
| 2009/0203217 A1 | 8/2009 | Lee et al. | |

* cited by examiner

*Primary Examiner* — Calvin Lee
*Assistant Examiner* — Monica D Harrison
(74) *Attorney, Agent, or Firm* — Beyer Law Group LLP

(57) ABSTRACT

A method for adjusting the geometry of photomask patterns is provided. Such adjusted pattern can be employed to achieve pattern doubling in subsequent layers. A patterned photoresist mask is provided over an underlayer. A polymer layer is placed over the mask. The mask is selectively trimmed to generate individual mask features having an increased aspect ratio. Subsequent pattern layers can be formed on the trimmed mask pattern to generate a hard mask having increased pattern density. The hard mask is selectively etched and the material of the trimmed mask pattern is removed. The underlayer is then etched to achieve pattern transfer from the hard mask to the underlayer to achieve a final double density pattern.

22 Claims, 11 Drawing Sheets

ASPECT RATIO ADJUSTMENT OF MASK PATTERN USING TRIMMING TO ALTER GEOMETRY OF PHOTORESIST FEATURES

FIELD OF INVENTION

The present invention relates to the formation of semiconductor devices. More particularly, the present invention relates to the shaping of photoresist mask features and the uses of such shaped mask features in the fabrication of semiconductor devices and structures.

BACKGROUND OF THE INVENTION

During semiconductor wafer processing, semiconductor devices are structures are defined and formed in the wafer using well known patterning and etching processes. In many of these processes, a photoresist (PR) material is used to assist in the formation of these structures. Commonly, photoresist material is deposited on the wafer and then exposed to light filtered by a mask reticle to achieve a patterned photoresist mask. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

The minimum feature size of integrated circuits (ICs) continues to shrink with each generation of semiconductor wafer processing improvements. As transistors and metal lines get smaller and move closer together, this puts increasing demands on the photoresist materials and patterns. Previously insignificant third-order variables now play a major role in IC design and fabrication.

One significant limitation in the existing state of the art pertains to the thickness or vertical height of the photoresist layer. In existing technologies, depth of focus limitations inherent in the patterning equipment prevent the application of photoresist in layers thicker than they are currently used. However, there is a need in the industry for ever thicker mask layers to achieve certain fabrication structures. Currently, this need is met by transferring the mask pattern from the photoresist pattern to an underlying film to create an underlying "hard mask" having taller features which are then used to form various structures on the substrate. This approach has the unfortunate drawback of requiring additional steps to form the second mask which requires more time and has its own unique complications.

One example of a prior art process is depicted in FIGS. 1A-1D. In FIG. 1A a substrate 100 is provided having a number of structural and possibly circuit features. In this depiction, a layer 101 that is to be patterned is shown. The prior art achieves a narrow feature spacing in the following manner. The process continues with the formation of a hard mask layer that is to be etched into the desired hard mask pattern. FIG. 1B depicts layer 101 with an etch stop layer 102 formed thereon. Further, a hard mask layer 103 is formed on the etch stop layer 102. It is over this hard mask layer 103 which a photoresist layer is formed, exposed, and developed into mask pattern 104. The process continues as shown by FIG. 1C. As shown trenches 105 are etched into the hard mask layer 103 to define a plurality of tall and narrow hard mask features 103a that now serve as a hard mask pattern 106. This pattern 106 defines a pattern to be etched into the underlying material 101 to define a desired structure. This can enable high density feature formation and robust resistance to etch conditions. If desired, the photoresist material of the mask 104 can be removed prior to patterning the underlying substrate 101.

In a subsequent substrate etch step the pattern is transferred into the substrate 101 using an etch process to achieve the desired pattern in the layer 101. FIG. 1D depicts a series of etched features 101a formed in the layer 101. Typically, once the pattern 101a has been transferred to the substrate 101, the hard mask pattern of features 103a are removed so that further processing can occur.

The process of generating the hard mask 106 is time consuming and many of the processes used for its formation and removal can degrade the substrate and the quality of the pattern therein. Also, this process is limited to the critical dimension that is established by the initial mask pattern.

Methods for reducing process steps and processes that eliminate the need for a hard mask are advantageous. Moreover, processes capable of forming pattern doubled structures are needed.

SUMMARY OF THE INVENTION

To achieve the foregoing and in accordance with the purpose of the present invention, a method for generating a mask pattern with an array of mask features having an improved shape and geometry is disclosed. In one embodiment, the method begins with a patterned photoresist mask on a semiconductor substrate. Upon this pattern is placed a conformal polymer layer that coats the substrate, including the top surfaces and sidewall surfaces of the photoresist mask features. The mask features are selectively trimmed and shaped by trimming at least one of: a portion of the polymer layer from said sidewalls or a portion of both the sidewall polymer layer and photoresist material from the sidewalls of the mask features. Such a process being conducted such that it modulates the aspect ratio of the mask features.

In a further embodiment of the invention, the above process further includes operations of depositing a conformal hard mask material over the trimmed and shaped mask features. The hard mask is then etched to expose portions of the trimmed and shaped mask features which are then removed to provide a patterned hard mask layer characterized by a pattern doubled configuration. The underlying substrate is etched through openings in the patterned hard mask to transfer the pattern to the substrate to form a pattern doubled feature configuration in the substrate. The hard mask is then removed.

Another manifestation of the invention provides for a method for shaping the geometry of the mask features of an array of such features. The method includes placing a semiconductor substrate in an inductive plasma reactor chamber. The substrate arranged with a patterned photoresist mask formed on the substrate surface. The photoresist mask including a plurality of mask features. Each mask feature having a top surface and sidewalls. A conformal polymer layer is placed over the mask features in the inductive plasma reactor chamber by flowing a deposition gas into the chamber, transforming the deposition gas into a deposition plasma, and depositing the conformal polymer layer on the mask feature. The mask features are then shaped to alter the feature geometry to increase the aspect ratio of the mask features. Such shaping process includes flowing a trimming gas into the chamber, generating a trim plasma, and trimming the polymer layer and photoresist material from sidewalls of the plurality mask features such that the mask features become narrower.

In a further manifestation of the invention, the method is used to form and shape a photoresist mask pattern in an inductive plasma chamber as disclosed above. The pattern being formed using a photoresist mask, forming a conformal layer of polymer on the mask features, and then trimming the features using a trim plasma to form an array of shaped mask features. Another layer of material is then deposited as a conformal layer upon the array of shaped mask features. Such layer being formed on the top and sidewall portions of the shaped mask features and in interstitial spaces between said array of shaped mask features. Portions of the conformal layer of material are removed such that openings are made in the conformal layer to expose upper portions of the shaped mask features while substantial portions of the conformal layer of material remain in place. The shaped mask features are removed through the openings conformal layer leaving a hard mask of the conformal material. Material is then removed from the hard mask to generate an array of features comprised of said conformal layer of material. In some embodiments, the conformal layer is etched into a resultant array of features having a resultant feature density that is greater than an initial feature density for the plurality of mask features of the photoresist mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
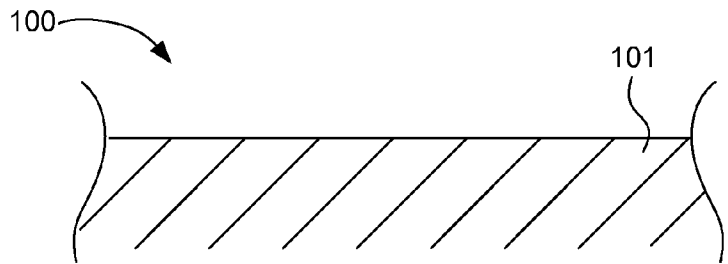
FIGS. 1A-1D illustrate a prior art hard mask formation process.
Figure 1B:
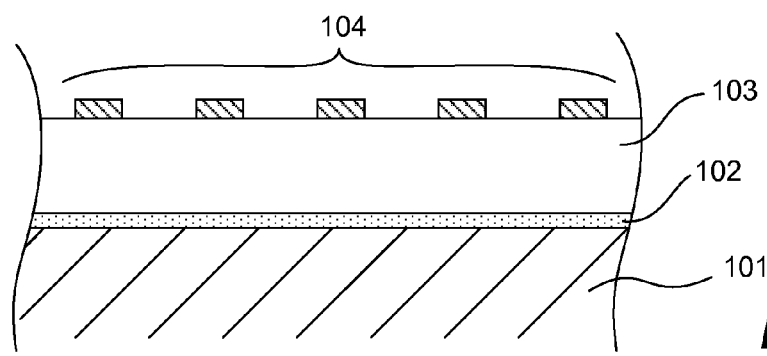
Figure 1C:
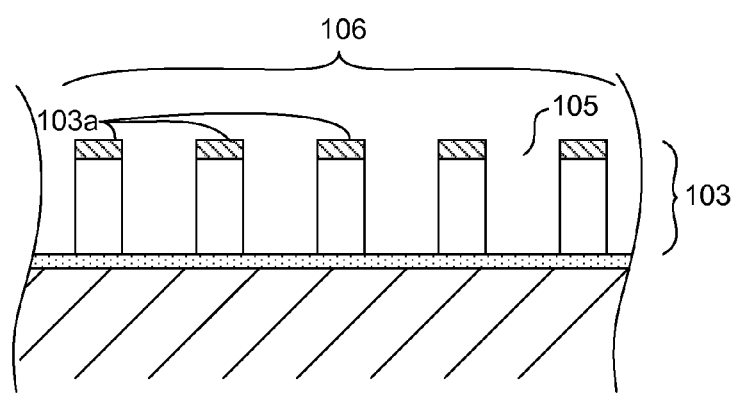
Figure 1D:
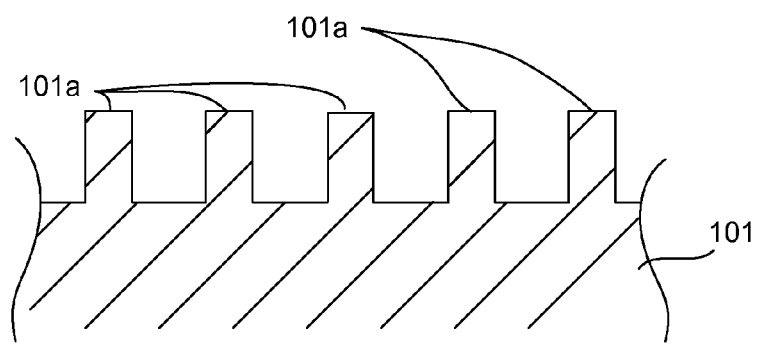
Figure 2:
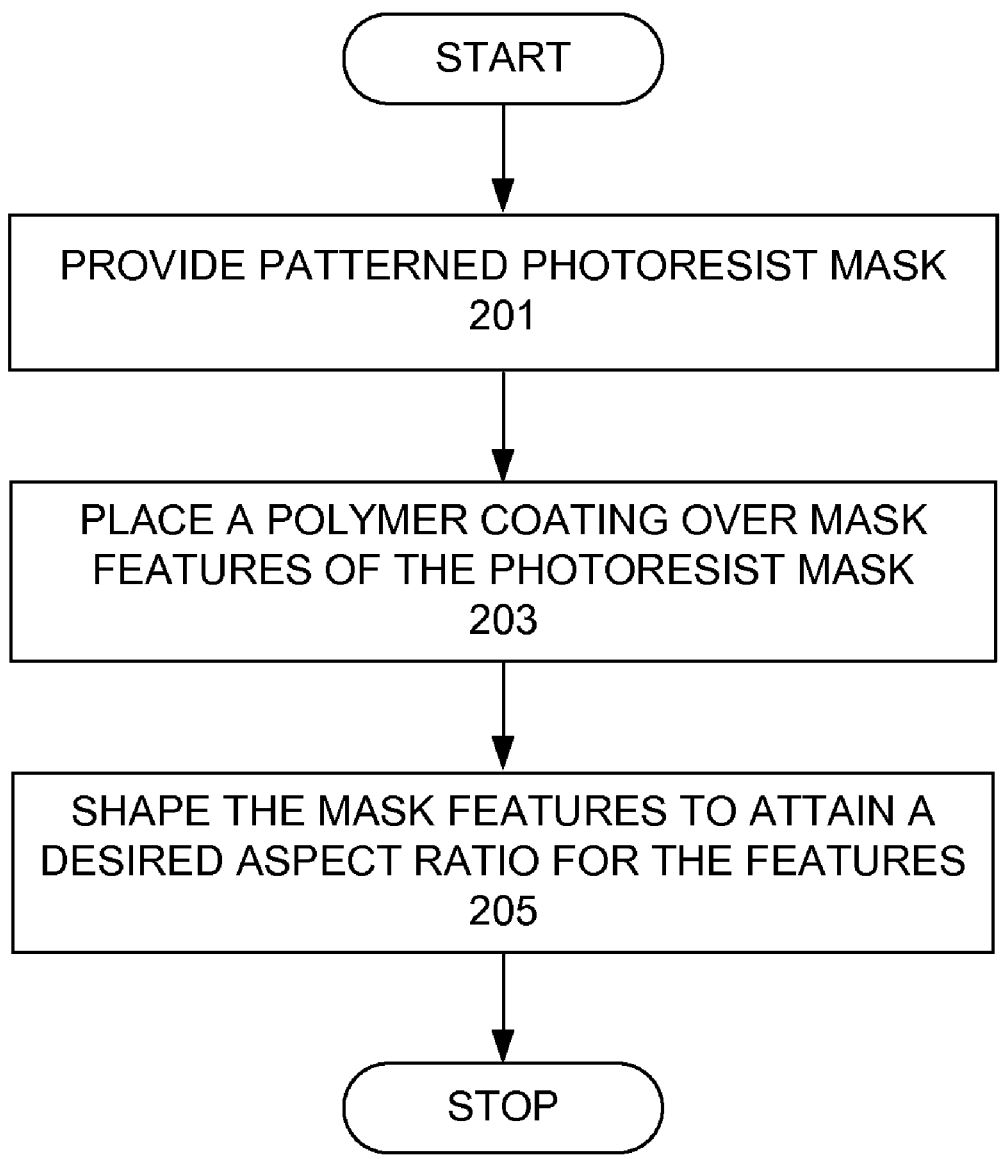
FIG. 2 is a flow diagram illustrating a process that may be used modulate mask feature geometry in accordance with an embodiment of the invention.
Figure 3A:
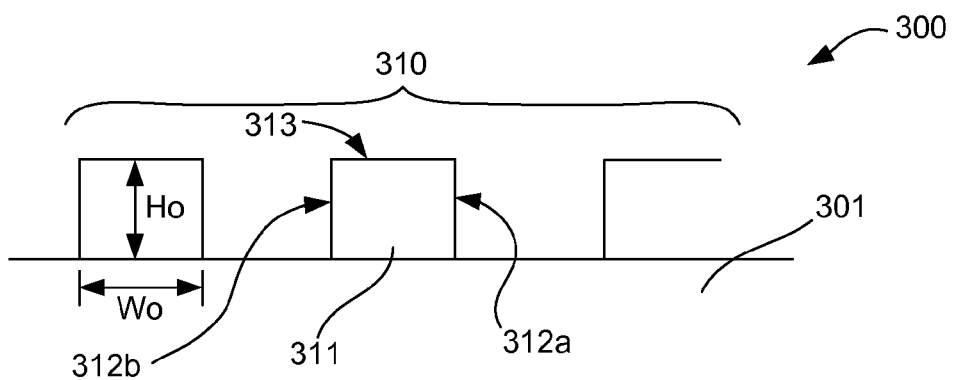
FIGS. 3A-3E are schematic cross-sectional views of mask feature processing and mask geometry shaping processes according to an embodiment of the invention.

To facilitate understanding, FIG. 2 is a high level flow chart of a process that may be used in an embodiment of the invention. A patterned photoresist mask is provided (Step 201). FIG. 3A is a schematic cross-section view of a pattern masked substrate 300 in accordance with the principles of the invention. A patterned photoresist mask 310 with photoresist features 311 is shown formed over the underlayer 301. The underlayer 301 schematically represents a wide range of potential structures, materials, combinations of materials and layers such as are used in semiconductor circuit fabrication. The photoresist mask 310 can be formed using a wide range photoresist materials. By way of example, the mask 310 can be formed using the Black Diamond® family of photoresist materials manufactured by Applied Materials, Inc of Santa Clara, Calif.

The features 311 of the patterned photoresist mask 310 include a top surface 313 and sidewalls (e.g., as shown here, the pair of sidewalls 312a, 312b). The features of the mask pattern have a height dimension $H_0$ that describes the height (the vertical thickness) of the photoresist layer and, in particular, the vertical thickness of the feature 311 in question. Also, each feature has a width dimension $W_0$ that describes the horizontal distance from sidewall 312a to sidewall 312b thereby defining how wide a given feature 311 is. Although not specifically limited to these parameters, suitable photoresist features have a height dimension $H_0$ of about 50-150 nanometers (nm). Although, features of any width can be employed in accordance with the principles of the invention, aspects of the invention find particular utility when used with arrays of features constructed such that the features are less than about 60 nm wide $W_0$.

The substrate 301 may be formed of a number of different layers, it can be comprised of many known organic, inorganic, or metal layers. For exemplary purposes and not intended to be limiting, the surface of the substrate 301 may be an anti-reflective layer (ARL), bottom anti-reflective coating (BARC), dielectric anti-reflective coating (DARC), amorphous carbon, or any other materials known to a person of ordinary skill in the art. Under this is a wide range of underlayer materials, stacks, or structures. Examples, include, but are not limited to hard mask materials, dielectric materials such as $Si_xO_y$, $Si_xN_y$, $Si_xO_yN_z$, conductive materials, and any other known underlayers. Additionally, the substrate may comprise a number of different circuit elements and circuit structures. For example, it can comprise individual or arrays of transistors, diodes, circuit paths, and/or more complicated circuit elements.

Figure 3B:
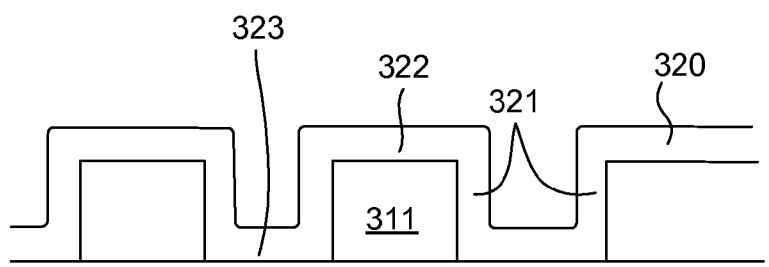

Returning to FIG. 2 a coating may be placed over the photoresist mask (Step 203). FIG. 3B shows the deposition of a polymer layer 320 on the mask pattern 310. Such deposition is preferably performed using an inductive reactor chamber such as KIYO® manufactured by Lam Research Corp. of Fremont Calif. or a DPS system produced by Applied Materials, Inc. of Santa Clara, Calif. Such a coating may be deposited by introducing a resist masked substrate 300 into an appropriate deposition chamber. Deposition gas is then flowed into the deposition chamber, typically in the presence of a carrier gas. Where the gases can be energized into a plasma and a polymer layer can be deposited.

Particularly useful deposition gasses include, but are not limited to, small organic molecules. Examples include, hydrocarbons like $CH_4$, $C_2H_4$, $C_2H_6$, as well as others. Further example materials include fluorocarbons and hydrofluorocarbons. A fluorocarbon may have a chemical formula $C_xF_y$, with one suitable example comprising $C_4F_8$. Also, suitable are hydrofluorocarbons (those materials having a chemical formula $C_xH_yF_z$). Also, the inventors point out that silicon based deposition gases can be used. Some examples include, but are not limited to, silane, fluorosilanes (e.g., $SiF_4$), or chlorosilanes (e.g., $SiCl_4$) which can also be used to form this layer 320. The inventors further point out that some of these deposition gases can be combined to achieve desired deposition parameters. Additionally, inert gasses can operate as carrier media for the deposition gases. Common carrier gasses include, but are not limited to, He, Ne, Ar, and Xe gases. As indicated above, deposition gases are flowed into the chamber and a plasma is created enabling the deposition of the polymer layer 320. It should be noted that in certain embodiments, the polymer layer 320 is deposited in a thinner layer 321 on the sidewalls than it is on the more horizontal surfaces which are demonstrate greater layer thicknesses 322, 323.

Figure 3C:
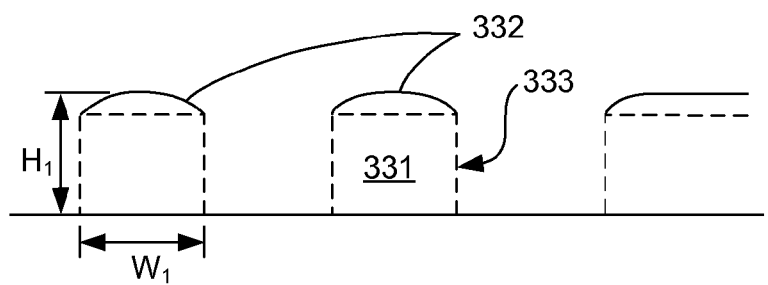

Returning to FIG. 2 the mask features are selectively trimmed to create features having the desired geometry (Step 205). For example, the feature is trimmed to form a mask feature having a higher aspect ratio. As defined here, "aspect ratio" is the ratio of feature height to feature width. Using FIG. 3A as an example, the aspect ratio of mask feature 311 is the ratio $H_0/W_0$. Higher aspect ratios mean that the features are taller and narrower and can be more closely spaced, leading to higher density patterns. FIG. 3C shows one embodiment of the selective trimming of material from the mask feature 311. The polymer layer 320 is trimmed such that the feature attains a higher aspect ratio. As will be explained in more detail with respect to the various embodiments, this can be achieved in a number of ways.

In further discussion of FIG. 3C, trimming describes a process whereby the polymer layer 320 is trimmed from the sides 321 the mask feature 311. The trimming can be further conducted so that photoresist portions of the sidewalls 312a, 312b themselves are trimmed away. This generates a narrower profile for the trimmed feature 331. For example, as shown in FIG. 3C, portions of the polymer layer 321 are removed from the sidewalls and portions of the sidewalls are also removed (depicted by dashed lines 333 on the sidewalls). Accordingly, the trimmed feature 331 has a narrower width $W_1$. In this depicted approach, the trimming process removes some (but not all) of the polymer layer 322 from the top of the feature to leave a residuary layer 332 of polymer at the top of the feature. This is intentional. This produces a trimmed feature 331 having a greater height dimension $H_1$ and a smaller width dimension $W_1$ than the initial feature 311. This increases the aspect ratio of the resulting feature 331. It should be noted that the trimming can be continued until the residuary layer 332 is removed. This will further narrow the feature 331.

The following discusses a generalized approach for achieving such trimming. A polymer coated substrate remains in situ in the aforementioned inductive reactor chamber and trimming gas is then flowed into the chamber. Particularly useful trimming gasses include, but are not limited to, oxygen containing gasses, many nitrogen-containing gasses, and non-hydrocarbon hydrogen containing gasses. Examples of suitable materials include $O_2$ and $H_2$. Also, it has been determined that ammonia gasses or a combination of $N_2$ gas with $H_2$ gas work well together. It has also been determined that some processes are improved by introducing a "passivation" gas to modulate the trimming effect. For example, $Cl_2$ and HBr are suitable passivation gasses that can be flowed into the chamber with another trim gas, like $O_2$. In some embodiments, the trim gas may be flowed into the chamber along with a carrier gas. In particular, inert gases, such as nobel gases (He, Ne, Ar, Xe) are particularly suitable carriers.

The process indicated by FIGS. 3B and 3C (Steps 203 & 205) can be iteratively performed as a modulation cycle used to adjust the aspect ratio of the mask feature by alternatively performing the operations of depositing polymer layer and trimming to adjust the geometry of the feature. This is shown schematically in FIG. 4. The cycle 401 includes a deposition phase 402 (such as 203 of FIG. 2) and illustrated by FIG. 3B and the supporting portions of the specification. The cycle 401 also includes a trimming phase 403 (such as 205 of FIG. 2) and illustrated by FIG. 3C and the supporting portions of the specification. The gases are ignited to form a trim plasma that enables the selective removal of the polymer layer and also photoresist material.

Figure 3D:
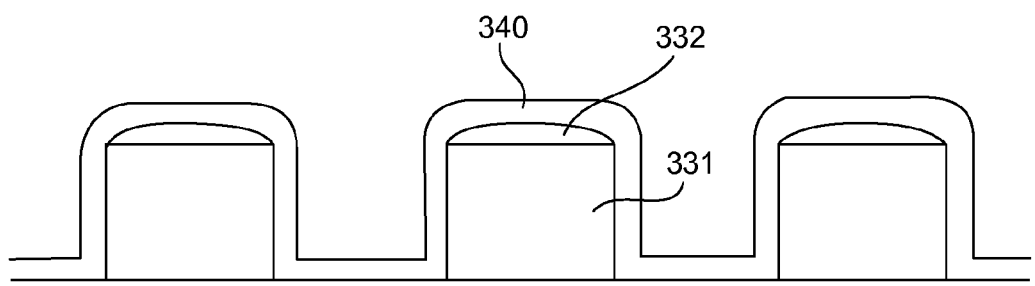
Figure 3E:
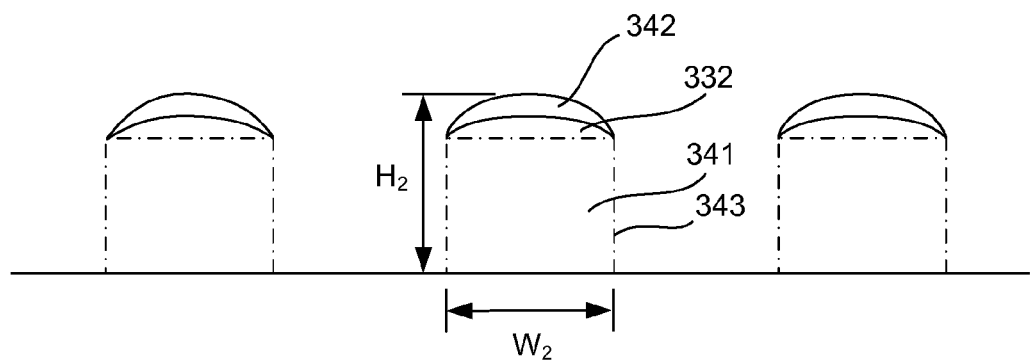

To continue with a description of the modulation cycle 401, reference is made to FIG. 3D. Another polymer layer 340 is formed on the feature 331 as well as on the remaining portion 332 of the previous polymer layer. As before, the horizontal surfaces can be somewhat thicker than the sidewall portions of the polymer layer. Although the process of forming the polymer layer 340 can be substantially similar to that used to form layer 320 of FIG. 3B, the inventors point out, that changes to the parameters and materials can be made to attain the desired properties in the layer. Then, as before, the modulation cycle continues with another trimming operation to further adjust the geometry of the resultant mask feature. For example, as shown in FIG. 3E, again, portions of the polymer layer 340 are trimmed from the sidewalls of the feature 331 to further increase aspect ratio by narrowing the profile for the resultant trimmed feature 341. As before, portions of the sidewalls may be removed (depicted by alternating dotted dashed lines 343 on the sidewalls) such that a trimmed feature 341 having a still narrower width $W_2$ remains. In this depicted approach, the trimming process also removes portions 342 of the polymer layer 340 from the top of the feature. Thus, polymer layer portions 332, 342 remain on top the trimmed feature 341 further building the height of the feature 341. Thus, the trimmed feature 341 has a still greater height dimension $H_2$ as well as a thinner width $W_2$ than the prior features 311, 331 thereby further increasing the aspect ratio of the resulting feature 341. This cycle 401 may be repeated as many times as needed to obtain the desired shape of the mask feature. In one application, the process uses 2-7 cycles to obtain the desired mask feature shape.

As a general proposition, other embodiments can be used to alter the trimming profile of the resulting mask feature. For example, the trimming can be conducted so that the initial photoresist mask feature is not thinned at all. Instead the aspect ratio (the ratio of feature height H to feature width W) is increased by building up successive layers of polymer material on top of the photoresist mask feature to progressively increase its height until a desired height is reached and/or a desired aspect ratio is obtained for the feature. In other words, during trimming, the polymer layer is trimmed on the sidewalls, but the photoresist material remains largely untouched. In another approach, the mask features are more aggressively thinned. In such an embodiment the trimming is performed until little, if any, polymer layer remains on the top of the mask feature and substantially all of the increase of the aspect ratio is attained through the process of thinning the width of the feature.

EXAMPLE

In an example of this process, a patterned photoresist layer is formed (Step 201). A substrate 300 having an underlayer 301 and a patterned photoresist mask 310 is placed in a processing chamber of an inductive coupled power (ICP) plasma processing device.

Figure 5:
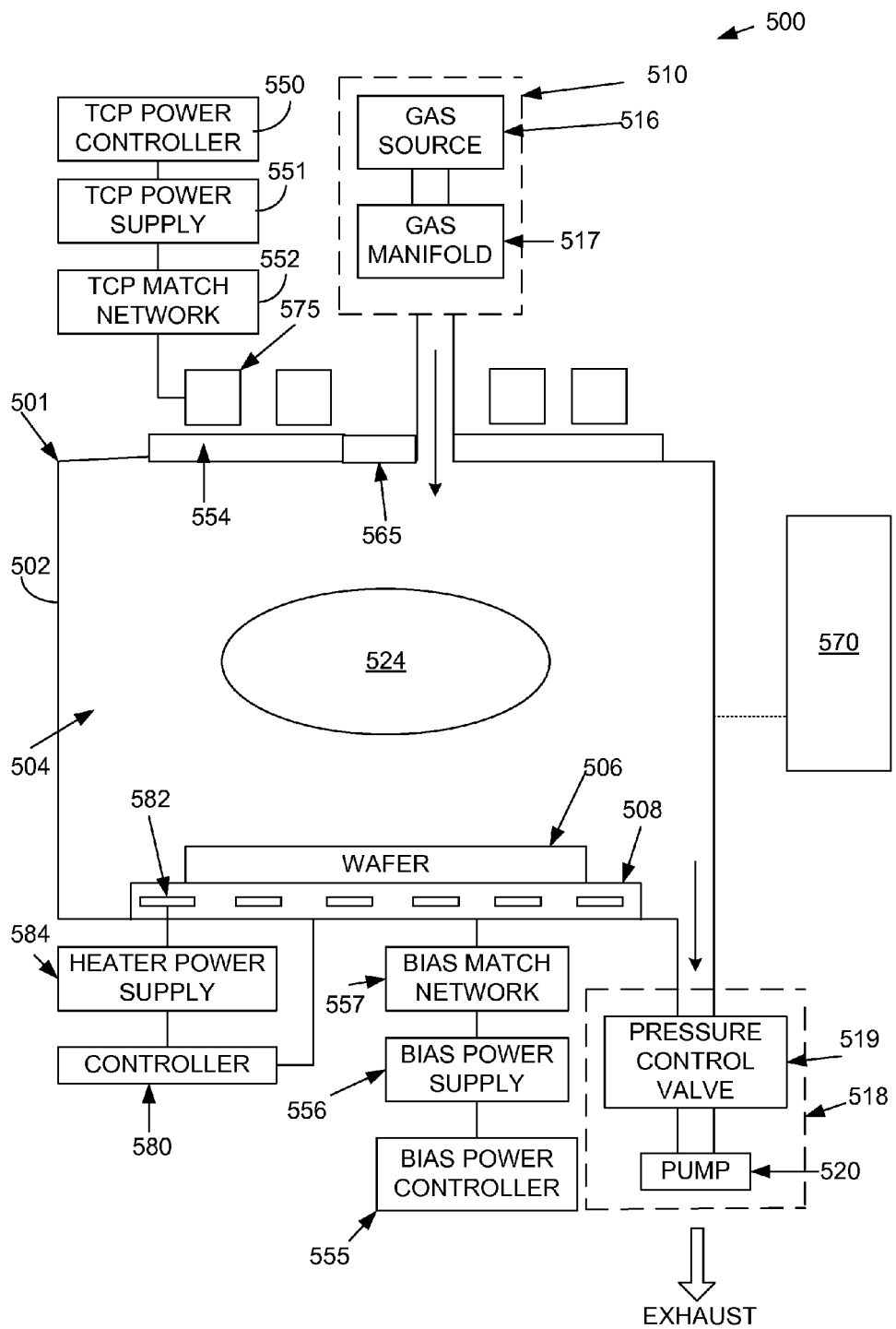
FIG. 5 is a schematic view of a plasma processing chamber that may be used in practicing the invention.

FIG. 5 is a schematic view of a plasma processing system 500 that may be used for placing a polymer layer over a photoresist mask and trimming the photoresist mask features. Plasma processing system 500 may include a plasma processing tool 501 which is an inductively coupled plasma processing tool and includes a plasma reactor processing chamber 504 therein. A transformer coupled power (TCP) controller 550 and a bias power controller 555, respectively, control a TCP power supply 551 and a bias power supply 556 influencing the plasma 524 created within plasma chamber 504.

The TCP power controller 550 sets a set point for TCP power supply 551 configured to supply a radio frequency signal at 13.56 MHz, tuned by a TCP match network 552, to a TCP coil 575 located near the plasma chamber 504. An RF transparent window 554 is provided to separate TCP coil 575 from plasma chamber 504 while allowing energy to pass from TCP coil 575 to plasma chamber 504. An optically transparent window 565 may be provided by a circular piece of sapphire having a diameter of approximately 2.5 cm (1 inch) located in an aperture in the RF transparent window 554.

The bias power controller 555 sets a set point for bias power supply 556 configured to supply an RF signal, tuned by bias match network 557, to a chuck electrode 508 located within the plasma chamber 504 creating a direct current (DC) bias above electrode 508 which is adapted to receive a substrate 506, such as a semi-conductor wafer work piece, being processed.

A gas supply mechanism or gas source 510 includes a source or sources of gas or gases 516 attached via a gas manifold 517 to supply the proper chemistry required for the process to the interior of the plasma chamber 504. A gas exhaust mechanism 518 includes a pressure control valve 519 and exhaust pump 520 and removes particles from within the plasma chamber 504 and maintains a particular pressure within plasma chamber 504.

A temperature controller 580 controls the temperature of heaters 582 provided within the chuck electrode 508 by controlling a heater power supply 584. The plasma processing system 500 also includes electronic control circuitry 570.

Figure 6A:
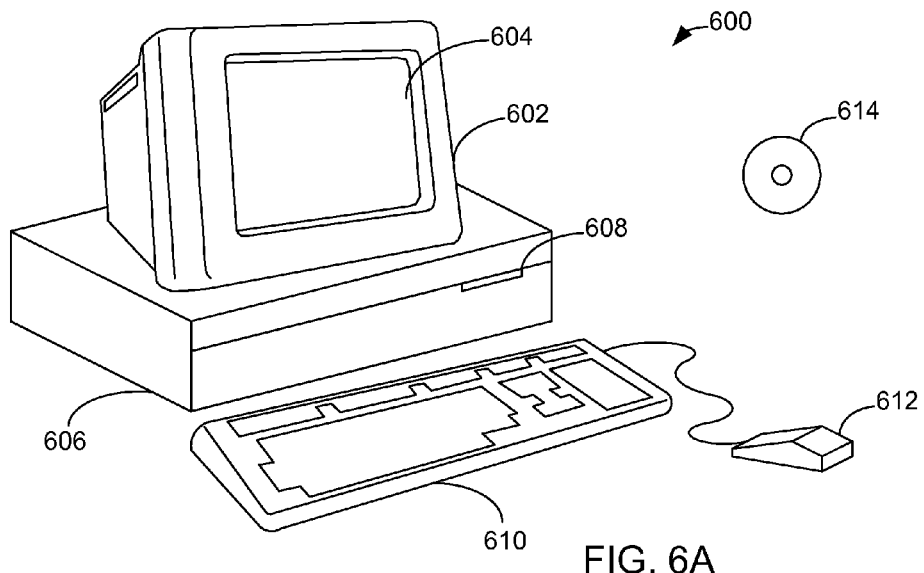
FIG. 6A-B illustrate a computer system, which is suitable for implementing the various process operations and controlling the apparatus' used in embodiments of the present invention.
Figure 6B:
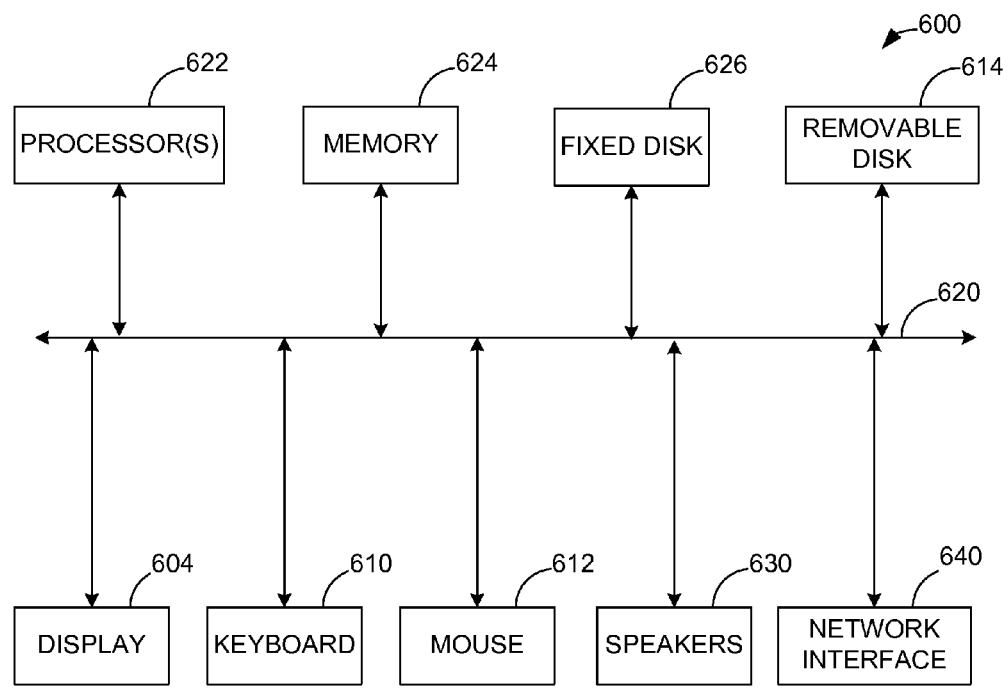

FIGS. 6A and 6B illustrate a computer system 600, which is suitable for implementing a controller 670 used in embodiments of the present invention. FIG. 6A shows one possible physical form of the computer system. Of course, the computer system may have many physical forms ranging from an integrated circuit, a printed circuit board, and a small handheld device up to a huge super computer. Computer system 600 includes a monitor 602, a display 604, a housing 606, a disk drive 608, a keyboard 610, and a mouse 612. Disk 614 is a computer-readable medium used to transfer data to and from computer system 600.

FIG. 6B is an example of a block diagram for computer system 600. Attached to system bus 620 is a wide variety of subsystems. Processor(s) 622 (also referred to as central processing units or CPUs) are coupled to storage devices, including memory 624. Memory 624 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 626 is also coupled bi-directionally to CPU 622; it provides additional data storage capacity and may also include any of the computer-readable media described below. Fixed disk 626 may be used to store programs, data, and the like and is typically a secondary storage medium (such as a hard disk) that is slower than primary storage. It will be appreciated that the information retained within fixed disk 626 may, in appropriate cases, be incorporated in standard fashion as virtual memory in memory 624. Removable disk 614 may take the form of any of the computer-readable media described below.

CPU 622 is also coupled to a variety of input/output devices, such as display 604, keyboard 610, mouse 612, and speakers 630. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 622 optionally may be coupled to another computer or telecommunications network using network interface 640. With such a network interface, it is contemplated that the CPU might receive information from the network, or might output information to the network in the course of performing the above-described method steps. Furthermore, method embodiments of the present invention may execute solely upon CPU 622 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor. Such computer readable media may also be computer code instructions embedded in the circuitry of the device 500 or the computer systems 600.

In one embodiment, the systems above can be applied to previously described embodiments in the following example process. A polymer layer 320 is placed over the photoresist mask 310 (Step 203). In this embodiment the features 311 are formed having a width $W_0$ of less than about 60 nm wide and a height $H_0$ in the range of about 50-150 nm.

Referring again to FIG. 2 and FIG. 4, the process of deposition is performed to produce a substrate with a deposited polymer layer as in FIG. 3B. A suitable deposition gas is flowed into the chamber and a plasma is generated and deposition is performed. Such a deposition gas includes at least one of $CH_4$, $C_2H_4$, $C_2H_6$, $C_4F_8$, and $C_xH_yF_z$. The inventors reiterate that other materials can be used including, but not limited to, silicon based coating materials. In this example, a processing chamber pressure in the range of about of 2-15 mT and power range from about 2 Watts (W) to about 800 W can be used at 13.56 MHz. The operating temperature may range between about 0° C.-50° C. Flow rates in the range of about 10-100 sccm (Standard Cubic Centimeters per Minute) of deposition gas and 0-500 sccm of carrier gas can be used. In some embodiments, carrier gases of He and Ar are preferred. However, the inventors point out that other embodiments can use Ne, Xe, or, alternatively, no carrier gas at all. During the process a bias of 0-150 V (volts) can be applied. The inventors point out that in many embodiments, a very low voltage in the range of about 0-10 V is used.

The deposition is generally performed for 5-20 seconds depending on the thickness desired. By adjusting the various deposition parameters a number of different thickness polymer layers can be formed. Additionally, in typical embodiments, the layer of polymer 320 varies depending on surface geography. The polymer layer 320 is typically thicker 322, 323 on the generally horizontal surfaces and thinner on the sidewall surfaces 321. Surfaces on the order of 5-15 nm are preferred in this embodiment. However, the inventors point out that any thickness of polymer layer can be used. Typically, the thicknesses of the sidewall portions of the polymer layer are on the order of about 70% of the top thickness. Thus, sidewall thicknesses 321 of in the range of about 5-10 nm are easily formed. The inventors also point out that a sidewall thickness 321 of as little as 1 nm can have a great deal of utility in accordance with the principles of the invention.

In one example recipe, $CH_4$ is flowed into the chamber at 50 sccm at a pressure of 5 mTorr. A deposition plasma is generated by providing 500 watts of TCP power at 13.56 MHz and a bias voltage is set at 0 volts. Deposition is conducted for about 10 seconds to form a polymer layer having a top thickness of about 10 nm.

Figure 4:
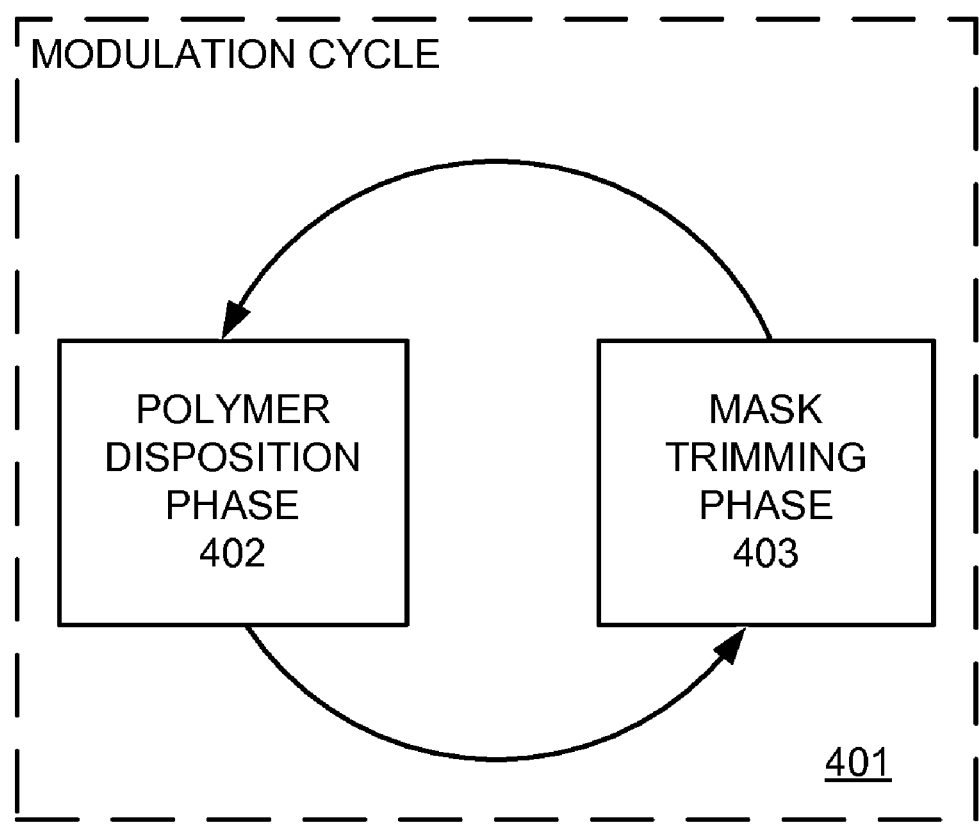
FIG. 4 is a flow diagram illustrating a feature modulation cycle used to adjust the geometry of the features of a mask pattern in accordance with the principles of an embodiment the invention.

With continuing reference to FIG. 2 (Step 205) and FIG. 4 (Step 403), the coated mask feature 311 (FIG. 3B) is trimmed. One example of such a trimmed feature is schematically depicted in FIG. 3C. A range of suitable trimming parameters is described. For example, suitable trimming gases include an oxygen-containing compound which is chemical compound that includes oxygen component molecules. An example of one particularly useful oxygen-containing compound is $O_2$ gas. The inventors have discovered that another oxygen-containing compound, $CO_2$, also works well, as do a number of other oxygen-containing materials. Non-carbon containing hydrogen materials have also been discovered to work well. Examples include, but are not limited to $H_2$ and $NH_3$. The inventors have also discovered that a combination of $H_2$ and $N_2$ gases can be flowed together to achieve good trimming results. Additionally, the trimming effect of $O_2$ can be adjusted by mixing the $O_2$ gas with $Cl_2$ or HBr gases.

However, in this embodiment a combination of $O_2$ gas with $Cl_2$ gas may be flowed into the chamber. Example ratios of $O_2$ to $Cl_2$ range from 3:1 to 1:3. These ratios can be used to modulate the trim rate of the resulting plasma. This embodiment can use a chamber pressure may of in the range of about of 2-30 mT. A plasma processing chamber power can range from about 2 Watts (W) to about 800 W at 13.56 MHz with a temperature range between about 0° C.-50° C. Flow rates in the range of about 10-100 sccm of trimming gas and 0-500 sccm of a He carrier gas can be used. A bias of 0-150 V (volts) can be applied with trimming performed for 3-15 seconds depending on the chemistry and desired amount of trimming desired. The inventors also point out that in many embodiments, a voltage in the lower end of the range gives better results. So a voltage in the range of about 0-10 V may be used.

As explained above, such trimming parameters can either trim the polymer layer away from the sides while leaving a substantial polymer residue on the top of the feature, building a taller feature having the same or nearly the same width. Alternatively, the trimming parameters can be adjusted to trim the polymer layer 321 away from the sidewalls (e.g., 312a, 312b) and also to trim away portions of the sidewalls 333 such as illustrated in FIG. 3B and the present embodiment. This depicted embodiment leaves a residual portion of polymer residue 332 on the top surface 313 of the mask feature 331 such as shown in FIG. 3B. This provides an increased aspect ratio by both building the height of the feature and narrowing its width. As previously indicated, in another approach the trimming can continue until all, or nearly all, of the polymer layer is removed from the top of the feature and maximum sidewall trimming is achieved. This results in little change in the height of the feature but substantially larger changes in the width of the features. In all cases, the aspect ratio of the resulting mask feature increases. This effect is enhanced due to the increased thickness of the polymer layers on the horizontal surfaces of the substrate relative to the thickness of the polymer layer on the sidewalls.

One particular application of this embodiment is in the construction of high density pattern structures. In one implementation pattern doubling can be achieved. One example of such a process is described as follows in the flow diagram 700 of FIG. 7 and associated supporting FIGS. 8A-8H. A process can begin with a substrate having a photoresist mask pattern formed thereon (Step 701). A substrate such as the ones described in the paragraphs above is the patterned subject FIG. 8A depicts on illustrative substrate 801 having a photoresist mask pattern 802 formed thereon. As is typically the case, a photoresist layer is exposed in the presence of a reticle, the pattern is developed, and the excess material is removed leaving the pattern 802. This mask pattern has an initial feature density defined by the spacing between mask features 803.

In one implementation, mask features 803 are formed having a width $W_0$ of about 60 nm or less (with the depicted example being 60 nm wide). Moreover, in the cross-section view depicted in FIG. 8A, the features 803 have a spacing there between. In this embodiment, the pattern employs a plurality of mask features 803 arranged in a regularly spaced pattern with a substantially horizontal portion of the substrate 804 lying between the features 803. As illustrated here, the features 803 are spaced apart $S_0$ at similar distances (here the initial spacing $S_0$ is about 60 nm). In this embodiment, the feature height $H_0$ is about 100 nm. The inventors reiterate that the variation in width and height (thickness) parameters for the photoresist pattern can be quite large. However, beyond certain film thicknesses, high quality patterns are difficult to obtain using modern exposure systems. The present invention provides a method for transcending some of the limitations presented by these height difficulties.

Returning to FIG. 7 the geometry of the photoresist mask features is adjusted (Step 703). Typically, such adjustment includes repeated application of the modulation cycle 401 (such as described in FIGS. 2 and 4) until a desired profile is obtained for the features 803. The idea being to increase the aspect ratio of the features 803 to a desired dimension. For example, as shown in FIG. 8B, a polymer layer 804 is formed on the photoresist mask pattern 802. The layer may be formed using, for example, the methods described above. In one embodiment, the polymer layer 804 can be deposited in the range of 1-25 nm thick. A conformal layer is generally used. Commonly, the layer is formed with a greater thickness on the generally horizontal surfaces such as the tops of the features and the spaces between the features. Also, a relatively thinner layer is formed on the mask feature sidewalls. The layer 804 depicted here includes the thinner sidewall layers 813, the thicker top surface portions 811 of the layer, and the thicker portion 812 formed on the horizontal surfaces 804 between the features. Then, the geometry of the mask features 803 are modulated using a trim plasma to generate features having a higher aspect ratio. Examples of some suitable methodologies are discussed earlier in this patent. In this embodiment, a number of cycles of trimming and deposition are performed such that the features are progressively thinned and the height is also increased by retaining a substantial portion of the deposited top polymer layer 811. The portion of the substrate encircled by the dashed line circle of FIG. 8B is an expanded view of trimmed features and is shown in FIG. 8C. In one example process, a methane gas is used to generate the polymer layer wherein a combination of $O_2$ and $Cl_2$ gases are used to enable the desired trimming.

The substrate shown in FIG. 8C depicts the resultant features 823 after a series modulation cycles (e.g., 401 of FIG. 4). In this depiction, the feature has been trimmed such that width dimension $W_1$ has been reduced to about 30 nm. In the same processes the height $H_1$ of the feature is increased from about 100 nm to about 150 nm with polymer material 825. In this example, the interstitial space $S_1$ between features is increased by the sidewall trimming to about 90 nm.

Figure 7:
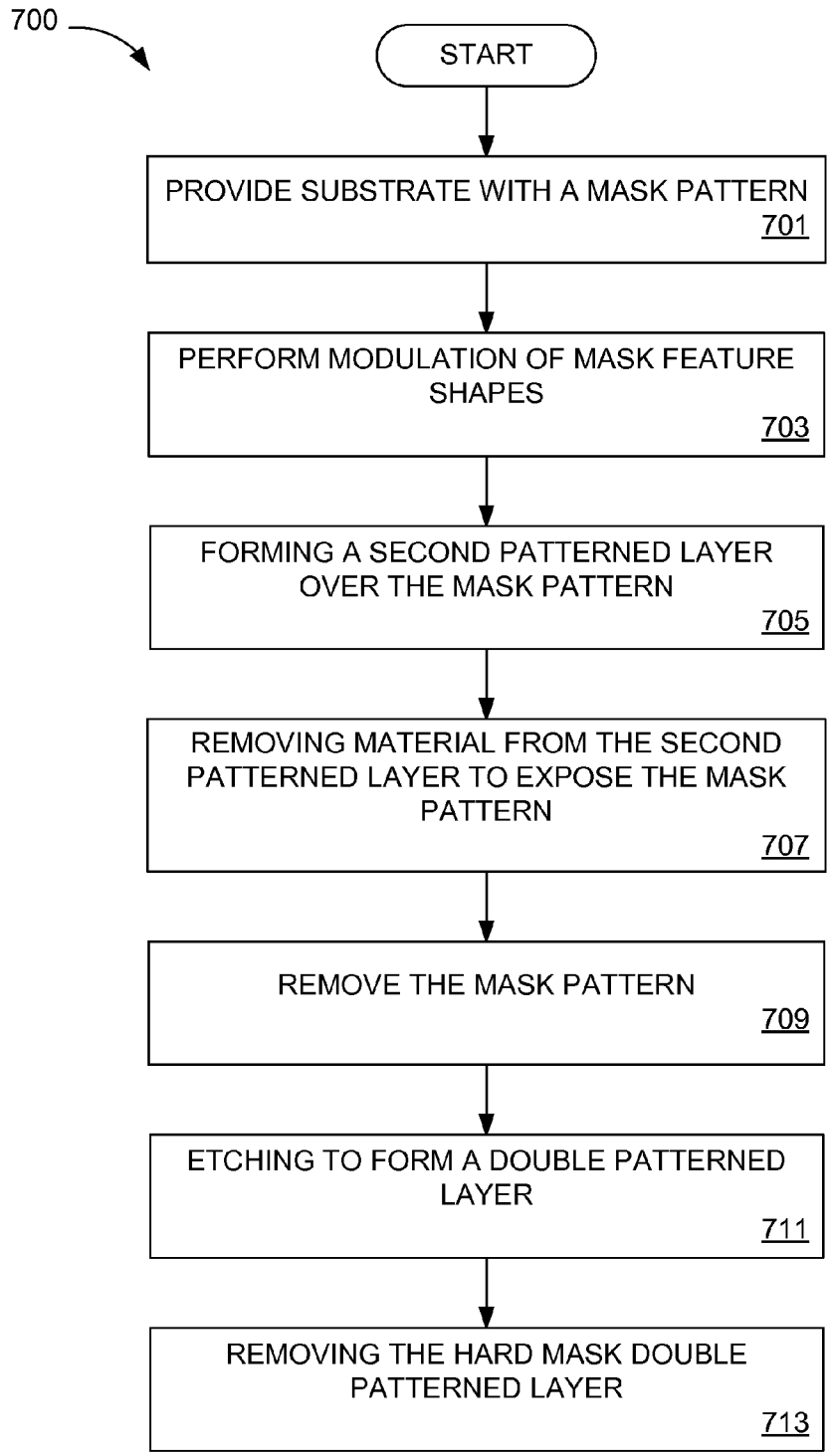
FIG. 7 is another more detailed flow diagram illustrating a methodology suitable for constructing double patterned structures and other features in accordance with the principles of the invention.
Figure 8A:
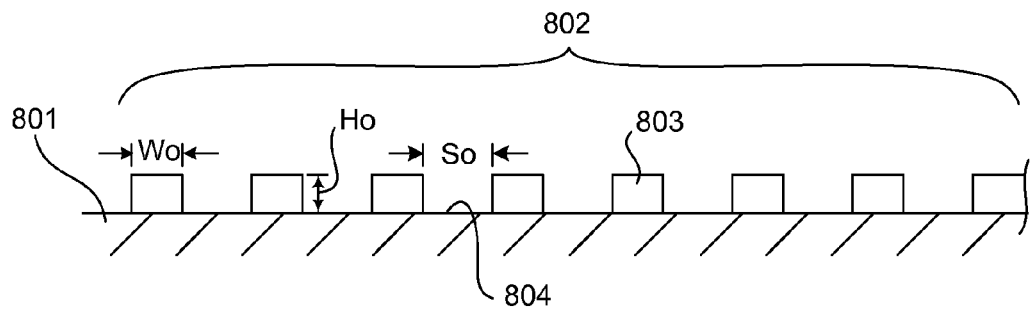
FIGS. 8A-8H are schematic cross-sectional views of a processing and mask geometry shaping embodiment used to form final structures that have increased feature density relative to an initial photomask pattern in accordance with an embodiment of the invention.
Figure 8B:
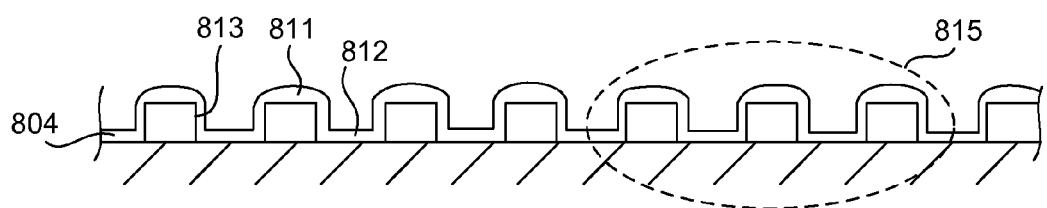
Figure 8C:
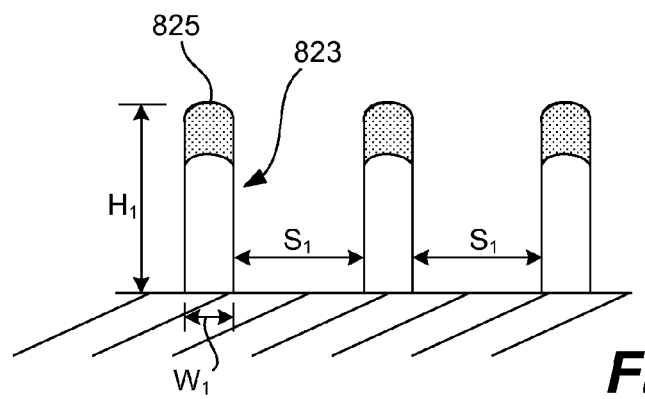
Figure 8D:
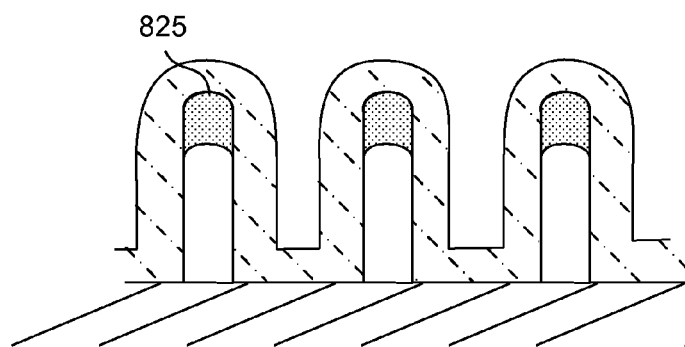

Referring again to the flow diagram of FIG. 7, a second patterned layer (or hard mask layer) is formed on the substrate (Step 705). This layer is a conformal layer that is subject to further patterning. This layer is essentially a hard mask layer that provides a basis for further etching and patterning of underlying layers. FIG. 8D depicts the formation of the hard mask layer 825 that is to be a basis for a later constructed structure. The hard mask layer 825 can be constructed of a wide range of semiconductor materials. In one embodiment, materials such as nitrides, oxides, oxynitrides, oxycarbides, $SiN_xH_y$ compounds, and a large array of other hard mask compatible materials may be used. Importantly, the inventors point out that particularly suitable materials for layer 825 are materials that demonstrate good etch selectivity between the material of the hard mask layer 825 and the photoresist mask features (i.e., photoresist material and/or the polymer material). Moreover, the inventors point out that many other materials can be used in the formation of layer 825. In this example, hard mask 825 is formed of a conformal layer of nitride material (for example, $Si_3N_4$) having a thickness of about 30 nm. The hard mask 825 covers both the horizontal substrate surfaces as well as the sidewalls. In particular, a conformal arrangement of the layer 825 on the photoresist and polymer mask features 823 is desirable. In this depicted embodiment, the nitride layer may be a silicon nitride layer deposited using a LPCVD process.

Figure 8E:
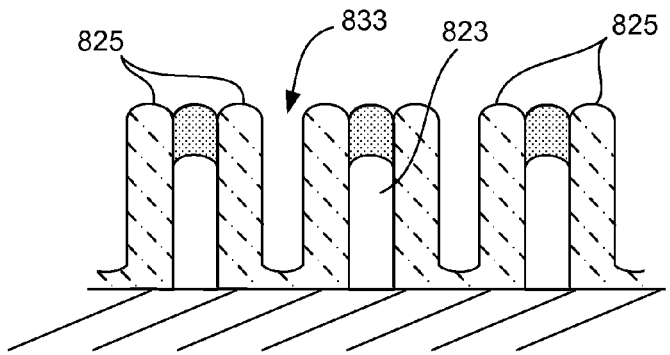

To continue with the flow diagram of FIG. 7 and associated FIG. 8E, the layer 825 is etched to expose the underlying mask features 823 (Step 707). This may leave a substrate such as shown in FIG. 8E. By exposing the mask features 823, they are now in a position to be removed using any of a number of suitable photomask removal processes. Thus, the process is well on its way to defining a pattern in the layer 825. Also, during this process, the horizontal interstitial regions 833 between the mask features 825 may be entirely removed (as shown in this view). Alternatively, in some embodiments, some of the hard mask material in region 833 can remain in situ to be removed in a later process. However, in general, complete removal of this material in the instant step is preferred.

Figure 8F:
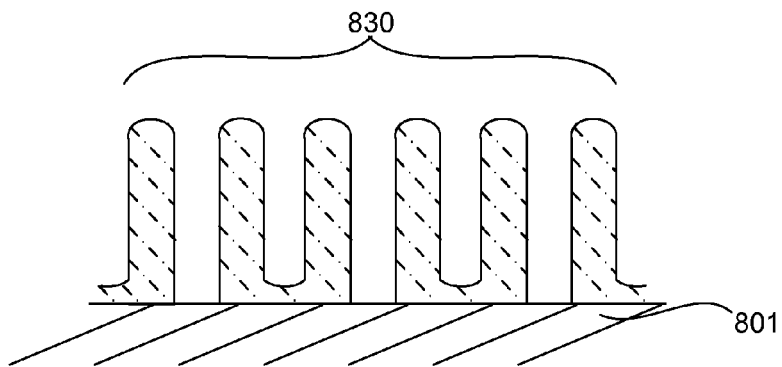

Returning again to flow diagram FIG. 7, the exposed mask features are now removed to further pattern the layer 823 (Step 709). FIG. 8F illustrates a substrate structure after the selective removal of the photomask 823 from the recesses in the hard mask pattern 825. By removing the exposed mask features 823 from the substrate a patterned hard mask layer 830 is left in place. Typically the mask features 823 are removed using any of a number of suitable photomask removal processes. One example of such a process is an etch process that is selective to photoresist material and the polymer layer. In other words the selected process etches photoresist and polymer materials well but is not as effective an etch process with respect to the hard mask materials 823. This process is used to remove the polymer and photoresist materials of the mask features and leaving the patterned hard mask pattern 830 in place as shown in FIG. 8F.

Figure 8G:
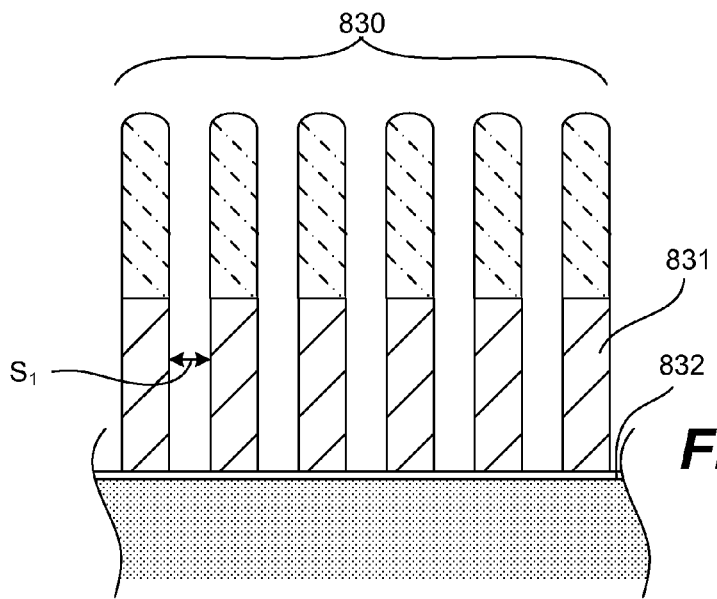

The flow diagram of FIG. 7 includes the step of etching the underlayer 801 using the hard mask 830 to form a set of patterned features 831 in the under layer 801 (Step 711). This process is used to remove the underlayer material as shown in FIG. 8G. In this embodiment, said etching proceeds until an underlying etch stop layer 832 is reached. Such an etch stop is not necessary but is helpful in many embodiments.

Figure 8H:
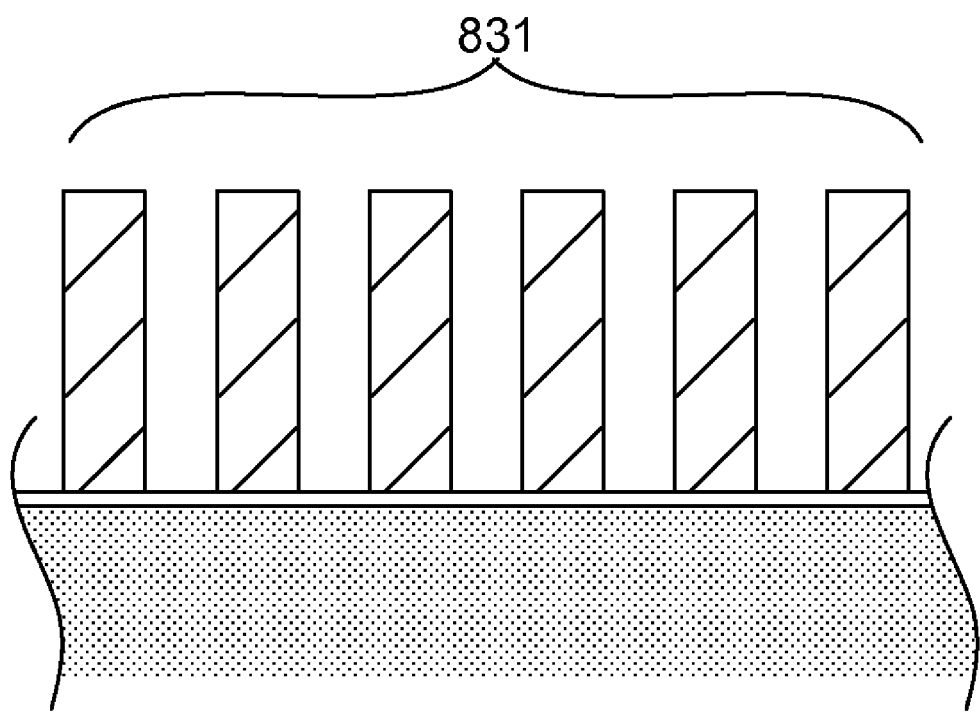

The flow diagram of FIG. 7 illustrates another step of removing the hard mask 830 material from patterned features 831 (Step 713) to form the etched double patterned layer 831 as shown in FIG. 8H. The inventors point out that one of the particularly useful aspects of one embodiment of the invention is that all of the steps 703-713 can be performed in the same chamber if desired. This substantially decreases processing time and therefore reduces costs.

As indicated above, one particularly useful feature of this process is its application to achieve "feature doubling". In such an application, the initial mask pattern 802 has a specified initial feature density (here, for example, a feature spacing of 60 nm). After processing in accordance with the principles of the invention, the hard mask feature spacing is decreased markedly. Using the specified hard mask, increased final feature density can be achieved (e.g., 831). Here, a resultant feature separation (e.g., features 831) of on the order of 30 nm is achieved. In such an embodiment, the feature density may be doubled from one feature every 60 nm to one feature every 30 nm. This is referred to as "pattern doubling" as depicted in FIG. 8G where the pattern of features 831 have twice the density of the initial photoresist mask features 803. Accordingly, the embodiment has a substantially reduced critical dimension. Thus, as explained above, this pattern now comprises a plurality of 30 nm wide features 831 separated by a distance $S_1$ of on the order of about 30 nm.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method, comprising:
   (a) placing a semiconductor substrate in an inductive plasma reactor chamber, the substrate including a patterned photoresist mask formed on a substrate surface, the photoresist mask including a plurality of mask features having a top surface and at least one sidewall;
   (b) placing a conformal polymer layer over the mask features, comprising:
      (i) flowing a deposition gas into the chamber;
      (ii) transforming the deposition gas into a plasma; and (iii) depositing the conformal polymer layer on the mask features;
(c) shaping the mask features to increase an aspect ratio of the mask features, comprising:
(i) flowing a trimming gas into the chamber;
(ii) transforming the trimming gas into a trim plasma; and
(iii) trimming the polymer layer and photoresist material from sidewalls of the plurality mask features with said trim plasma such that the mask features become narrower and a residual portion of the polymer layer remains on a top surface of the mask feature such that a height of the mask feature is increased.

2. The method of claim 1, wherein the process of (b)(i) flowing the deposition gas into the chamber comprises flowing at least one of $CH_4$, $C_2H_6$, $C_2H_4$, $CHF_3$, $CF_4$, $CH_2F_2$, $SiH_4$, $SiCl_4$, or $SiF_4$ into the chamber.

3. The method of claim 1, wherein (b)(iii) depositing the polymer layer includes depositing the plasma in the presence of a bias voltage with in the range of about 0-150 volts.

4. The method of claim 1, wherein the operations of: (b) placing the polymer layer, and (c) shaping the photoresist mask, comprise a modulation cycle and wherein the cycle is repeated until the mask feature attains a desired aspect ratio.

5. The method of claim 4, wherein a plurality of said modulation cycles shape the geometry of the plurality of mask features to form an array of shaped mask features such that each shaped mask feature has an increased aspect ratio relative to said features before said shaping wherein said aspect ratio is defined by a ratio of a feature height to a feature width.

6. The method of claim 4, wherein the modulation cycle is repeated for 2-7 cycles.

7. The method of claim 4, wherein the shaping the plurality of mask features comprises trimming such that said modulating of the aspect ratio is done such that the aspect ratio is increased.

8. The method of claim 1, wherein the process of (c)(i) flowing the trimming gas into the chamber comprises flowing an oxygen-containing gas into the chamber.

9. The method of claim 1, wherein the process of (c)(i) flowing the trimming gas into the chamber comprises flowing into the chamber at least one of an oxygen-containing gas, a carbon free hydrogen containing gas, or a nitrogen containing gas.

10. The method of claim 1, wherein the process of (c)(i) flowing the trimming gas into the chamber comprising flowing a combination of $O_2$ gas and $Cl_2$ gas such that the chamber has a gas ratio of $O_2$ gas to $Cl_2$ gas in a the range of about 1:3 to about 3:1.

11. The method of claim 1, wherein (c)(iii) trimming the polymer layer and sidewall includes trimming in the presence of a bias voltage in the range of about 0-150 volts.

12. A semiconductor device formed by the method of claim 1.

13. The method of claim 1 wherein c) shaping the mask feature includes increasing the aspect ratio of the mask feature by selectively trimming using an oxygen containing gas.

14. The method of claim 1 wherein shaping the mask feature includes increasing the aspect ratio of the mask feature by selectively trimming using at least one an oxygen containing gas, a nitrogen containing gas, or a carbon free hydrogen containing gas; and
wherein the process steps a)-c) are all performed in a single chamber of an inductive plasma reactor device.

15. A method, comprising:
(a) placing a semiconductor substrate in an inductive plasma reactor chamber, the substrate including a patterned photoresist mask formed on a substrate surface, the photoresist mask including a plurality of mask features having a top surface and at least one sidewall;
(b) placing a conformal polymer layer over the mask features, comprising:
(i) flowing a deposition gas into the chamber;
(ii) transforming the deposition gas into a plasma; and
(iii) depositing the conformal polymer layer on the mask feature;
(c) shaping the mask features to increase an aspect ratio of the mask features, comprising:
(i) flowing a trimming gas into the chamber;
(ii) transforming the trimming gas into a trim plasma; and
(iii) trimming the polymer layer and photoresist material from sidewalls of the plurality mask features with said trim plasma such that the mask features become narrower;
(d) depositing a conformal hard mask layer over the array of shaped mask features;
(e) partially removing portions of the hard mask layer such that openings are made in the hard mask layer to expose upper portions of the shaped mask features while substantial portions of the hard mask layer remain in place; and
(f) removing the shaped mask features through the openings in the hard mask layer to form a patterned hard mask layer.

16. The method of claim 15, wherein said depositing of the conformal hard mask layer upon the array of shaped mask features comprises depositing an oxide or nitride material as the conformal hard mask layer.

17. The method of claim 15, wherein said the substrate is etched through openings in said patterned hard mask layer defining an array of resultant features in the substrate, resultant features having a feature density that is greater than an initial feature density for the photoresist mask.

18. The method of claim 17, wherein the feature density of the resultant features is twice the feature density of the photoresist mask thereby defining a pattern doubled structure.

19. A method, comprising:
providing a substrate having an upper surface having a pattern of photoresist material formed thereon such that the pattern includes mask features having a top surface and at least one sidewall;
plasma depositing a conformal polymer layer onto a mask feature using a process of energizing a deposition gas to form a plasma and depositing the conformal polymer layer on a mask feature; and
after said deposition, shaping the mask features to increase an aspect ratio of the mask features by energizing a trim gas and trimming the polymer layer and photoresist material from mask feature sidewalls while leaving a polymer residue at an upper portion of the mask feature such that the mask features become taller and narrower.

20. The method of claim 19, wherein
plasma depositing a conformal polymer layer, comprises:
(i) flowing a deposition gas into the chamber;
(ii) transforming the deposition gas into a plasma; and
(iii) depositing the conformal polymer layer on the mask feature; and
shaping the mask features to comprises:
(i) flowing a trimming gas into the chamber;
(ii) transforming the trim gas into a trim plasma; and (iii) trimming the polymer layer and photoresist material from sidewalls of the plurality mask features with said trim plasma such that the mask features become narrower.

21. The method of claim 19, further comprising
depositing a conformal hard mask layer over the shaped mask features;
removing upper portions of the hard mask layer to form openings that expose upper portions of the shaped mask features while portions of the hard mask layer remain in place; and
removing the shaped mask features through the openings in the hard mask layer to form a patterned hard mask layer.

22. The method of claim 21, wherein removing the shaped mask features through the openings in the hard mask layer to form the patterned hard mask layer with feature doubling.

* * * * *